United States Patent [19]
Lee et al.

[11] Patent Number: 5,796,586
[45] Date of Patent: Aug. 18, 1998

[54] SUBSTRATE BOARD HAVING AN ANTI-ADHESIVE SOLDER MASK

[75] Inventors: Shaw Wei Lee, Cupertino, Calif.; Poh Ling Lee, Singapore, Singapore; Anthony E. Panczak, Sunnyvale, Calif.

[73] Assignee: National Semiconductor, Inc., Santa Clara, Calif.

[21] Appl. No.: 703,410

[22] Filed: Aug. 26, 1996

[51] Int. Cl.⁶ .................................................. H05K 1/03
[52] U.S. Cl. .......................... 361/748; 174/256; 174/258; 174/259; 174/260; 257/723
[58] Field of Search ...................... 27/825, 841, 846, 27/847; 174/250, 253, 256, 257, 258, 260, 261, 259; 228/179.1, 180.21, 180.22; 257/697, 698, 700, 701, 723, 724, 737, 738, 772, 778, 779, 780, 788, 787; 361/748, 760, 772, 774, 777, 779, 783; 438/125, 126, 129, 108, 612–614, 617; 439/68, 83; 427/96, 97, 103; 264/272.11, 272.17

[56] References Cited

U.S. PATENT DOCUMENTS

| | | | |
|---|---|---|---|
| 5,216,278 | 6/1993 | Lin et al. | 257/737 |
| 5,436,203 | 7/1995 | Lin | 438/613 |
| 5,457,341 | 10/1995 | West | 257/666 |

Primary Examiner—Donald Sparks
Attorney, Agent, or Firm—Beyer & Weaver, LLP

[57] ABSTRACT

Discloses is a method for making substrate boards for use in packaging semiconductor devices. The substrate board has a plurality of conductive traces patterned on at least one side, and an anti-adhesive solder mask is applied over and around conductive traces lying at an outer portion of the substrate board. The center portion of the substrate board will therefore remain uncovered by the anti-adhesive solder mask material. As a result, the uncovered center portion of the substrate board and conductive traces provide a surface area that is substantially more adhesive than the outer portion covered with the anti-adhesive solder mask.

23 Claims, 5 Drawing Sheets

SUBSTRATE BOARD HAVING AN ANTI-ADHESIVE SOLDER MASK

BACKGROUND OF THE INVENTION

The present invention relates generally to the packaging of integrated circuits. More particularly, the invention relates to substrate board designs used in packaged semiconductor devices.

Packaging semiconductors is a vital aspect of semiconductor manufacturing. Although there are many available packaging configurations, improvements are still needed. By way of example, a typical packaging configuration may require a number distinct manufacturing processes which may include: (a) the design and manufacture of substrates, (b) the design and application of conductive traces to the substrate, (c) the attachment of a semiconductor die to the substrate, and (d) the encasing of the semiconductor die. As can be appreciated, each stage in the manufacturing process will generally require close attention to detail. Thus, current packaging improvements have concentrated on improving and streamlining current manufacturing processes.

Although there are a number of methods for encasing semiconductor dies, hard molded plastic encapsulation is the most commonly implemented due to its highly protective, durable construction and low cost. Similarly, there are two commonly used methods for applying the plastic encapsulant material over the semiconductor die. The first method, and less popular, is referred to as "top gate" application. The second method, and more popular, is referred to as "bottom gate" application. In either application method, the plastic encapsulating material is applied in a liquid form onto a substrate after a semiconductor die is attached to the substrate.

FIG. 1A shows a plastic ball grid array (PBGA) type package and an injection mechanism used to apply a liquid plastic encapsulating material 30 over a die 20. Generally, the PBGA package of FIG. 1 includes a substrate board 16 on which a number of conductive traces (not shown) are patterned over the top and bottom surfaces. Typically, conductive vias are provided to establish a conductive path between the top and bottom surfaces. In this manner, conduction may be established between the die on the top surface to a plurality of solder balls 12 that are formed and attached to the bottom surface. As is well known in the art, substrate 16 typically includes a solder mask 18 formed over the top surface and a solder mask 14 formed over the bottom surface to protect the conductive traces during subsequent packaging processes and during actual use. After the solder masks have been applied, die 20 is interconnected to selected conductive traces by wire bonds 22.

Once the appropriate interconnections have been made with wire bonds 22, the liquid plastic encapsulating material 30 which is stored in a cylindrical container 28 is injected into a mold 24 that is placed over solder mask 18. By way of example, the injection of plastic encapsulating material 30 is typically facilitated with the use of a piston 34 that is configured to deliver a force to the bottom of cylindrical container 28. Before applying the force, plastic encapsulating material 30 is heated to an appropriate temperature (as for example, 185° C.). In this manner, plastic encapsulating material 30 will flow into and over die 20, and solder mask 18 through an injection port 32 which delivers the flow of plastic from a "top gate" arrangement.

Although this encasing process works well, the adhesion between the plastic encapsulating material 30 and solder mask 18 is typically quite poor, which could disrupt circuit operation. By way of example, if an improper or weak adhesive seal is made between plastic encapsulating material 30 and solder mask 18, the encapsulant material 25 applied over the solder mask (e.g., which results after mold 24 is removed) may become detached. Of course, even partial detachment could damage the die and potentially disconnect wire bonds 22 from die 20.

The poor adhesiveness of solder mask 18 has spurred the introduction of a number of highly adhesive solder masks. By way of example, some highly adhesive solder masks include liquid photo imagable (LPI) materials such as PSR4000-AUS5 and PSR 4000-AUS8 that are available from Taiyo, Japan. Consequently, these LPI solder mask materials are used due to their superior ability to bond to encapsulant material 25 and substrate board 16.

FIG. 1B shows plastic encapsulating material 30 being applied through a "bottom gate" process. As described above, current technology solders masks have been improved to be more adhesive so that encapsulant material 25 will adhere well to solder mask 18. Unfortunately, the improved adhesiveness has caused new problems during the application of plastic encapsulating material 30. That is, when plastic encapsulating material 30 is flown over die 20 using a bottom gate process, the plastic encapsulating material 30 will also adhere around a gate area.

As is well known in the art, the gate area refers to a top surface region where injection port 32 rests during the delivery of the liquid plastic encapsulating material 30. Frequently, excess encapsulating material 30 remains and hardens over the gate area where encapsulating material is not desired. Consequently, this excess encapsulating material must be removed (also referred to as "de-gating") as part of a routine packaging step. However, because current technology solder masks provide improved adhesiveness between the encapsulating material 30 and solder mask 18, the de-gating process tends to inadvertently remove regions of solder mask. When this happens, the conductive traces that underlie the solder mask 18 may become exposed, lifted off substrate board 16, or even torn away. Of course, if the conductive traces are exposed, short circuits or inadvertent interconnections may interfere with the proper operation of a packaged device.

One prior art attempt at solving this problem has been to add a gold plated pattern 26 over substrate board 16. As shown in FIGS 1B and 1C, gold plated pattern 26 is typically designed around the gate area where injection port 32 rests during a "bottom gate" application of plastic encapsulating material 30. In this manner, if excess plastic encapsulating material 30 remains and hardens over gold plated pattern 26, its removal will not damage the solder mask nor uncover conductive traces 23 patterned near gold plated pattern 26.

Although gold plated pattern 26 adequately protects the underlying solder mask during de-gating operations, conductive traces are typically avoided under gold plated pattern 26. This is because gold plated pattern 26 will occupy the routing area for the conductive traces 23 of a packaged semiconductor device. In addition, the large area of gold plating in gate area will generally increase the costs associated with packaging each semiconductor die. As a result, overall semiconductor packaging costs will tend to increase.

In view of the foregoing, there is a need for improved packaging arrangements and methods for providing good adhesion between encasing materials and substrate boards while facilitating the removal of excess encasing material around the gate area.

SUMMARY OF THE INVENTION

To achieve the foregoing in accordance with the purpose of the present invention, an improved circuit board for use in packaging semiconductor devices is disclosed. The circuit board includes a substrate having a plurality of conductive traces patterned over the substrate surface. An anti-adhesive solder mask is then positioned over at least part of the conductive traces such that a ring is defined around an outer portion of the substrate. In this manner, the center portion of the substrate is exposed and does not contain the solder mask material.

In a preferred embodiment, the anti-adhesive solder mask covers the perimeter of the top surface of the substrate. In various preferred embodiments, the solder mask is preferably selected from the group consisting of a polyimide, and a dry film solder mask.

In another aspect of the present invention, a method for making a circuit board for use in semiconductor packaging is disclosed. The method includes providing a substrate having a plurality of conductive traces patterned thereon. An anti-adhesive solder mask is at least partially applied over the conductive traces to substantially define a ring around an outer portion of the substrate, and a center portion of the substrate is exposed and does not contain the applied solder mask. In this manner, an encasing material may be applied over the center portion through a bottom gate process while preventing the encasing material from adhering to the solder mask.

In another embodiment of the present invention, a circuit board for use in a packaged semiconductor device is disclosed. The circuit board preferably includes a substrate having a plurality of conductive traces positioned thereon. A solder mask is then positioned over the substrate to substantially cover the conductive traces leaving a plurality of conductive trace tips exposed. An anti-adhesive pattern is then positioned over the solder mask in the location of a gate area. Advantageously, conductive traces may be patterned beneath the anti-adhesive gate area without conductively interfering with signals transmitted through the underlying conductive traces.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Figure 1A:
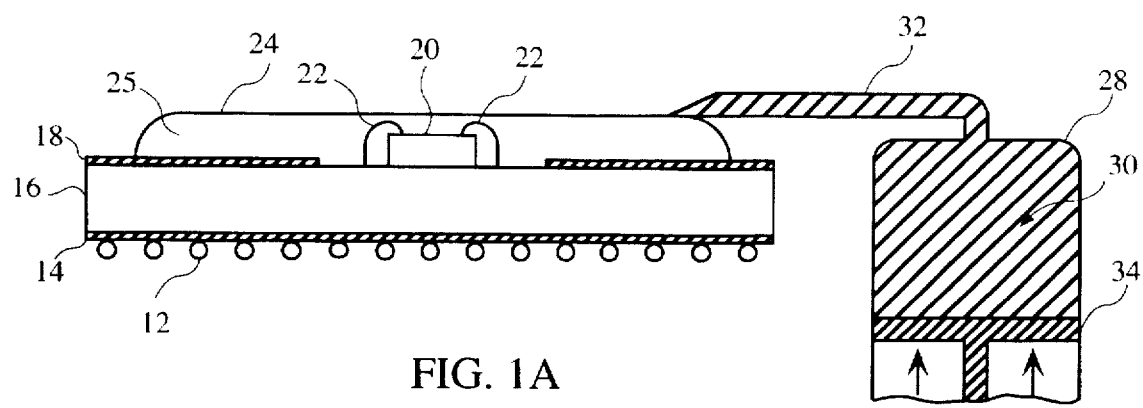
FIG. 1A shows a plastic ball grid array (PBGA) type package and an injection mechanism used to apply a liquid plastic encapsulant.
Figure 1B:
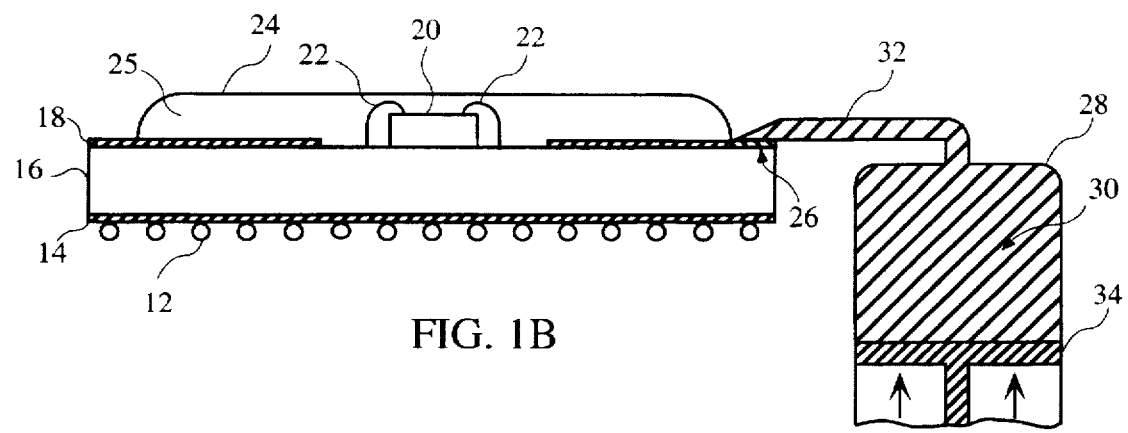
FIG. 1B shows liquid plastic encapsulating material applied through a "bottom gate" process.
Figure 1C:
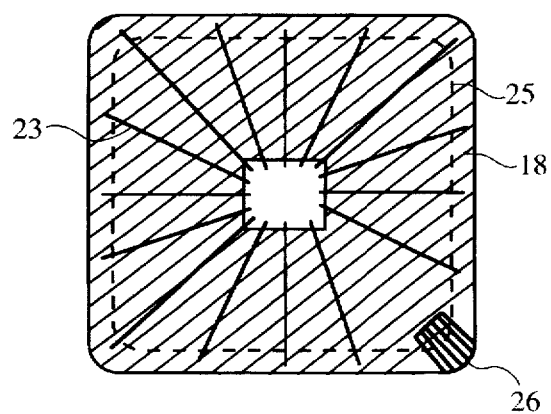
FIG. 1C is a top view of a packaged semiconductor device having a gold plated gate area.

FIGS. 1A through 1C have been described above to point out some of the disadvantages associated with several conventional substrate board designs.

Broadly speaking, the present invention presents an innovative substrate board and method for making substrate boards for use in packaging semiconductor devices. In one embodiment, the substrate board has at least a first surface area configured to receive a semiconductor die and a plurality of conductive traces. The substrate board has an anti-adhesive solder mask configured to protect the conductive traces patterned around an outer portion of the substrate board. In this manner, the center portion of the first surface area will remain uncovered by the anti-adhesive solder mask leaving the substrate board and conductive traces exposed. Advantageously, the uncovered substrate board and conductive traces present a surface area that is substantially more adhesive that the outer portion covered with the anti-adhesive solder mask.

Therefore, when the semiconductor die and its associated interconnections are encapsulated, the encapsulation material will form a secure bond with the center portion of the top surface. Furthermore, the encapsulating material may be injected into the center of the substrate board using a conventional bottom gate application process without having encapsulating material dangerously adhere to the surrounding solder mask. By way of example, when the solder mask is selected to be anti-adhesive, excess encapsulating material which forms and hardens over the gate area may be efficiently removed without dangerously lifting the portions of the solder mask or lifting portions of underlying conductive traces. The present invention will now be described in greater detail with reference to FIGS. 2A through 7.

Figure 2A:
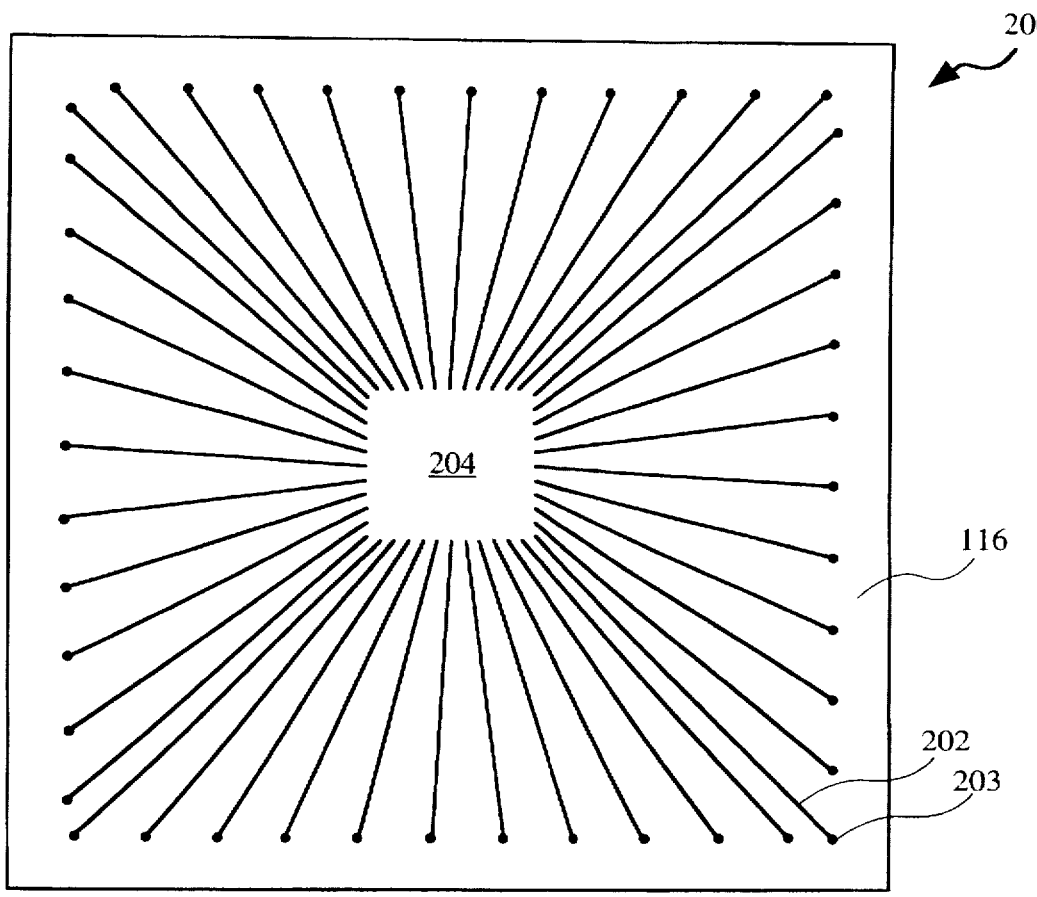
FIG. 2A is a top view of a substrate board having a plurality of patterned conductive traces in accordance with one embodiment of present invention.

FIG. 2A is a diagrammatic illustration of a top surface of a substrate board 200 having a plurality of conductive traces 202 patterned over a first surface 116. Generally, conductive traces 202 may be patterned to meet any custom arrangement suitable to interconnect a subsequently attached semiconductor die to a die attach area 204. By way of example, conductive traces 202 (e.g., typically copper) may be arranged to interconnect a semiconductor die attached to first surface 116 with a bottom surface (not shown) having a solder ball grid array. Typically, conductive traces 202 are connected to the bottom surface through a plurality of conductive vias 203. This type of packaging arrangement is referred to as a plastic ball grid array (PBGA) which is especially suited to handle semiconductor dies having a large number of input/output (I/O) interconnections. Further, conductive traces 202 should be designed such that an appropriate number of traces are made available for the semiconductor die being packaged. In this manner, each I/O pad on the semiconductor die is provided with a conductive path in and out of the packaged device. It should therefore be understood that the depicted radial design of conductive traces 202 is merely for illustrative purposes.

Figure 2B:
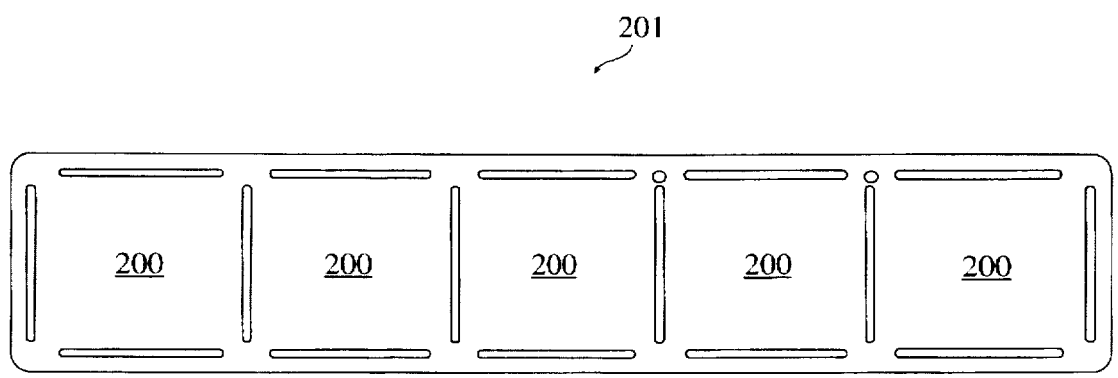
FIG. 2B is a top view of a multiple substrate board panel used in manufacturing the substrate board of FIG. 2A in accordance with one embodiment of present invention.

Substrate board 200 may be fabricated using any number of materials which are suitable for packaging integrated circuits. One suitable substrate board 200 material may be a bismalimide triagine (BT) resin. Further, it should be apparent to those skilled in the art that substrate board 200 is typically fabricated in a multi-substrate panel arrangement. For example, FIG. 2B shows a multiple substrate board panel 201 which illustratively includes five "in-line" individual substrate boards 200 that may be separated after a particular packaging step, or at the completion of the packaging process (e.g., after encapsulation and marking). This is typically done to increase packaging throughput and facilitate handling of multiple substrates at one time during manufacturing. Of course, multiple substrate board panel 201 may be reduced or enlarged to include any number of individual substrate boards 200.

Figure 3:
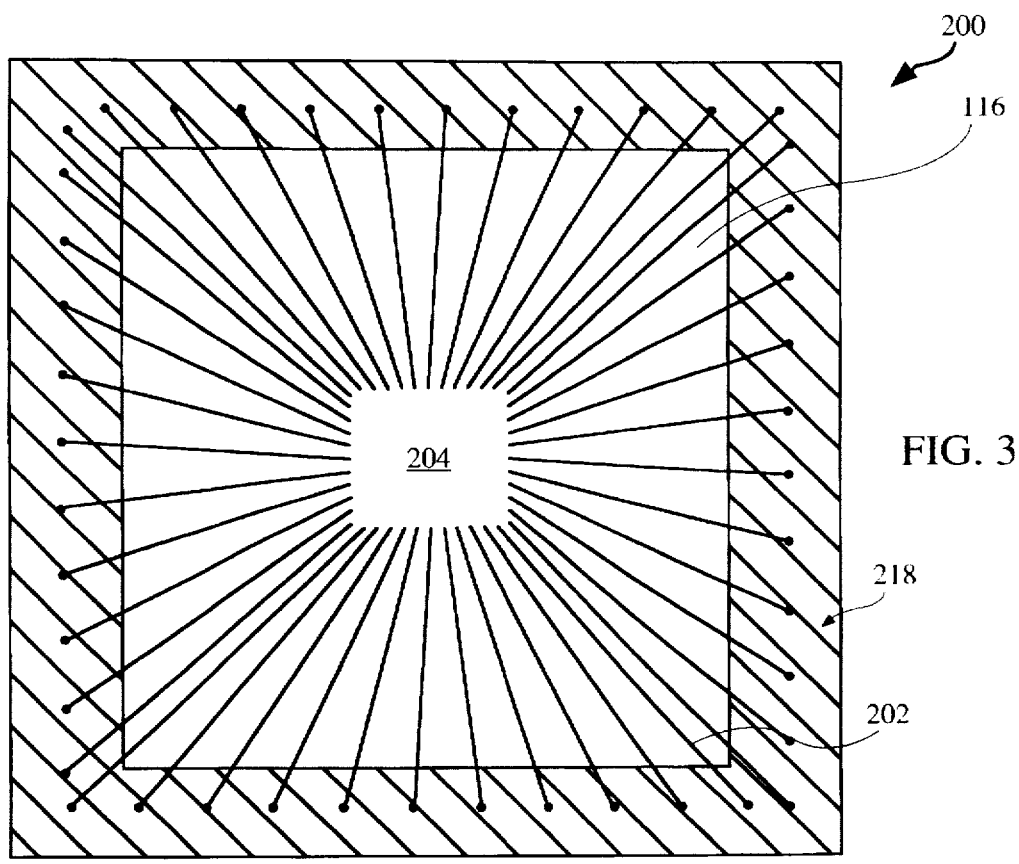
FIG. 3 is a top view of the substrate board of FIG. 2A after the application of an anti-adhesive solder mask in accordance with one embodiment of the present invention.

FIG. 3 shows substrate board 200 of FIG. 2A after the application of a solder mask 218. Solder mask 218 may be applied using any suitable patterning technique. By way of example, once solder mask material 218 is applied, it is masked and exposed to radiation. Then, regions of solder mask material 218 not protected from the radiation are removed.

Further, solder mask 218 will preferably have a ring width of between about 1 and 20 percent of a width of substrate board 200. More preferably, the ring width is between about 2 and 15 percent of the width of substrate board 200, and most preferably, the ring width is about 5 percent of the width of substrate board 200. In this manner, solder mask 218 will protect conductive traces 202 near the outer regions of substrate board 200 while the center portion is left unprotected until an encasing is applied over the center portion to protect the remainder of the conductive traces and a subsequently attached semiconductor die. In addition, solder mask 218 will preferably cover between about 5 percent and 30 percent of first surface 116, and most preferably about 10 percent.

Solder mask 218 will preferably be selected such that it is inherently anti-adhesive to encasing materials, while also being sufficiently adhesive to securely bond to substrate board 200 and the segments of underlying conductive traces 202. A suitable solder mask 218 material is preferably a polyimide compound. By way of example, suitable polyimide compounds can be obtained from DuPont Corporation of Wilmington, Delaware. As will be apparent to those skilled in the art, other suitable anti-adhesive solder mask materials may include dry film masking materials.

Functionally, solder mask 218 provides an insulative layer over portions of conductive traces 202 so that electrical signals are protected from inadvertent contact after the center portion has been encased with an encapsulating material. As will be described in greater detail below, anti-adhesive mask 218 is advantageously suited for the application of encasing materials through a "bottom gate" arrangement. By way of example, when excess encapsulating material remains and hardens near and around the gate area, removal of such material (e.g., de-gating) will be substantially facilitated since solder mask 218 will not form a tight bond with the encapsulating material. Therefore, when the encapsulating material is lifted off from the gate area, solder mask material 218 will remain substantially intact. That is, the solder mask 218 material will remain protectively positioned over portions of conductive traces 202 lying around the perimeter of substrate board 200 after any excess encapsulating material is lifted off.

A further advantage of this embodiment is that the location of the gate area where encapsulating material is injected from is not predefined. By way of example, as described in the background, some entities specifically identify a specific corner from which the encapsulating material is to be injected into the center portion. Once a corner is identified as a gate area, that corner is gold plated to facilitate de-gating operations. In contrast, this embodiment allows encapsulating materials to be injection into the center region of substrate board 200 from any side or corner which is covered with anti-adhesive mask 218. It should be appreciated that the present solder mask 218 composition and layout provides packaging manufactures with an added flexibility of being able to use existing encapsulation injectors that may be incompatible with conventional "predefined" gate areas.

Still referring to FIG. 3, after solder mask 218 has been appropriately applied, conductive traces 202 patterned within the center portion of first surface 116 are typically covered with a protective material to prevent the traces from oxidation during a subsequent wire bonding step. As described above, conductive traces 202 are preferably patterned copper conductive traces. Therefore, conductive traces 202 are typically gold plated over portions that do not have an overlying solder mask 218 film. Other suitable plating materials may include, for example, silver, and palladium. Alternatively, the conductive traces may be originally patterned with a material that is inherently resistive to oxidation, thereby circumventing the protective plating process.

Figure 4:
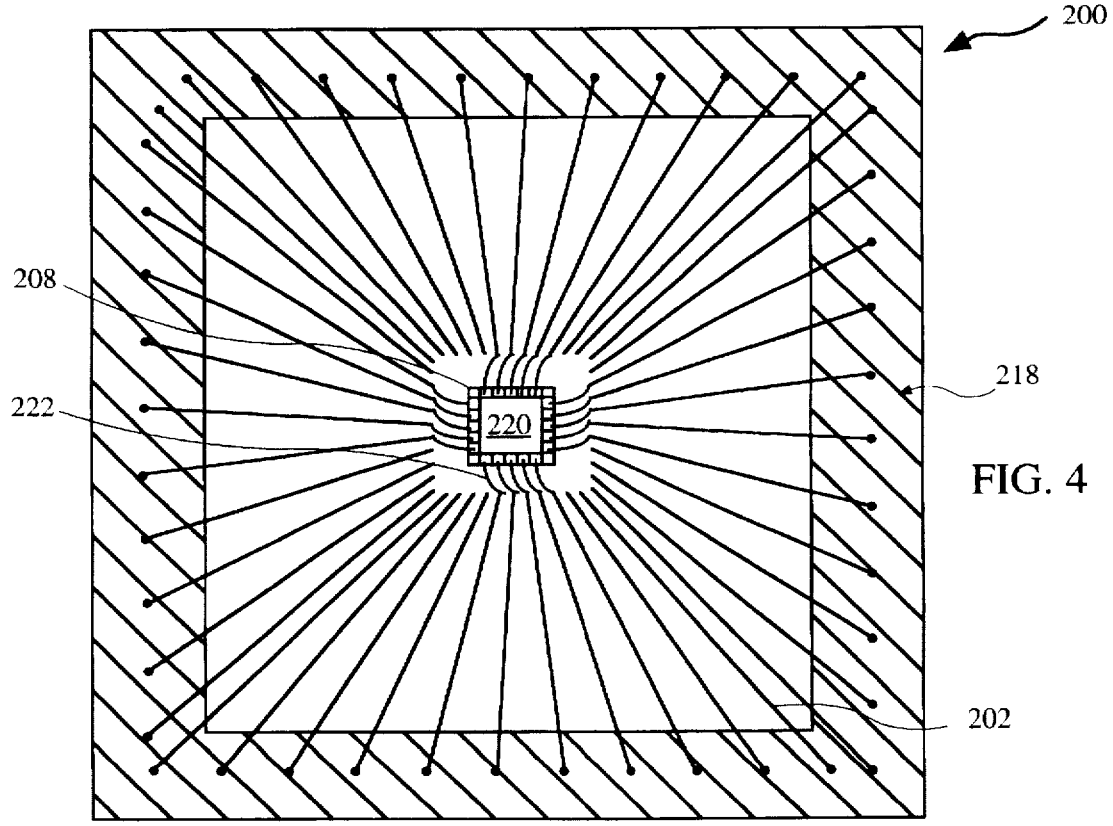
FIG. 4 is a top view of the substrate board of FIG. 3 after the application of a semiconductor die to the substrate board in accordance with one embodiment of the present invention.

FIG. 4 shows the substrate board 200 of FIG. 3 after a semiconductor die 220 is attached to die-attached area 204. Semiconductor die 220 may be attached to substrate board 200 using any suitable adhesive material. Well known attachment techniques include applying an adhesive directly to die attach area 204, or in some cases directly to the die just before it is placed in contact with die attach area 204.

Once semiconductor die 220 has been attached and cured to substrate board 200, appropriate wire bonds 222 are interconnected between selected I/O pads 208 on semiconductor die 220 and selected conductive traces 202. By way of example, any well known wire bonding apparatus may be implemented to perform the interconnections. However, it should be understood that other methods may be used to interconnect semiconductor die 220 to conductive traces 202. Examples of alternative interconnection methods include, tape automated bonding (TAB), directly attaching die contacts (not shown) to the surface of substrate board 200 (e.g., via flip-chip wafer bumps), Z axis conductive epoxies, etc.

Figure 5:
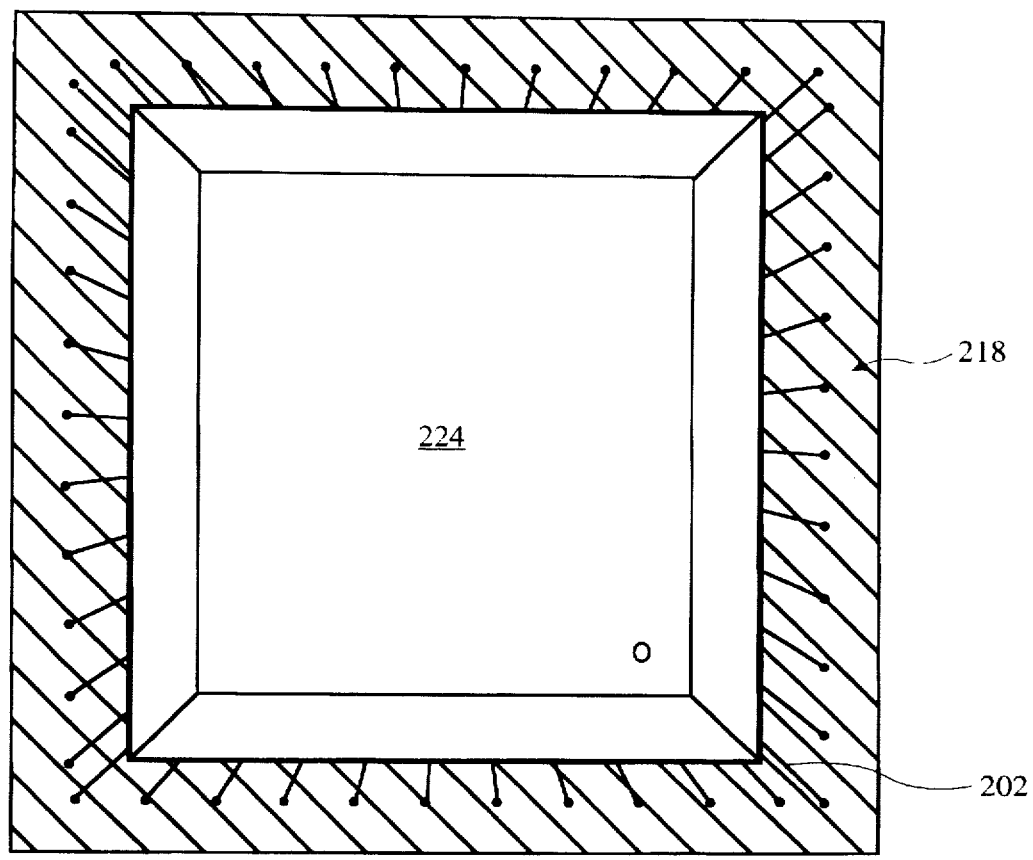
FIG. 5 is a top view of the substrate board of FIG. 4 after an encapsulating material has encased the center portion of the substrate board in accordance with one embodiment of the present invention.

FIG. 5 shows substrate board 200 having an encapsulating material 224 formed thereon. As illustrated, encapsulating material 224 will preferably lie over the center region of substrate board 200 such that the encapsulating material is in contact with first surface 116 and conductive traces 202 that were not covered with solder mask material 218. Advantageously, encapsulating material will naturally adhere very well to the center region and conductive traces 202 since anti-adhesive solder mask 218 is substantially located outside of the center portion where encapsulating material 224 is formed.

Any suitable encapsulating material that adheres well to substrate board 200 may be used. By way of example, suitable encapsulating materials may include mold compounds available from Hitachi Corporation of Japan. As is well known to those skilled in the art, encapsulating material 224 should be electrically non-conductive to avoid short circuits between wire bonds 222. In some cases, it may be necessary to include a flame retardant in the applied encapsulating material.

During fabrication, encapsulating material 224 is typically injected into a transfer mold that is placed over substrate board 200 during a "bottom gate" application process. As described above, bottom gate injection processes require that the encapsulating material 224 be injected from an edge of substrate board 200 (e.g., a gate region) into and over the center region of substrate board 200. As the encapsulating material is injected along the edge of the substrate board 200, the material will typically come in contact with portions of solder mask 218.

Consequently, once the encapsulating material hardens and the transfer mold is removed, a small amount of encapsulating material will remain over the gate area. Routinely, this excess material is removed during later steps in the molding process. Advantageously, this excess material will not adhere well to solder mask 218 and, therefore may be removed during a de-gating process without damaging the underlying solder mask 218 or lifting conductive traces 202 underlying solder mask 218. It should also be appreciated that additional cost savings may be realized since a layer of gold material over a special gate area is eliminated.

Further, as described above, since solder mask 218 is applied around substantially all of the outer perimeter, the injector of a bottom gate encapsulating material need not be placed at a predefined location. Although, injection from a corner is typically preferred.

Figure 6:
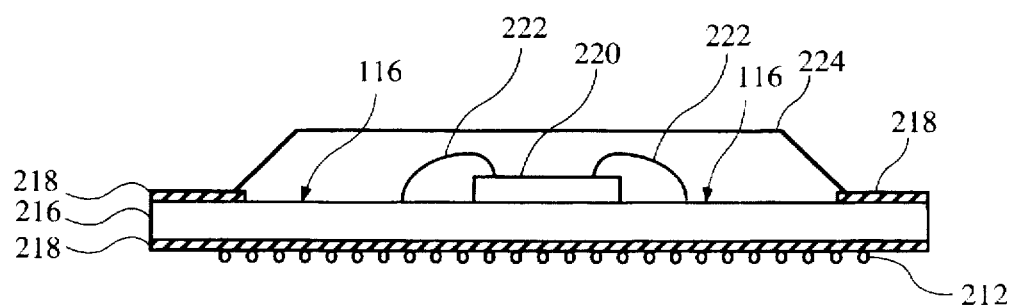
FIG. 6 is a cross-sectional perspective FIG. 5 showing the encapsulating material being formed over the center portion of the substrate board in accordance with one embodiment of the present invention.

FIG. 6 is a cross-sectional perspective of a PBGA package after encapsulating material 224 has been injected over the center region of substrate 200. However, it should be understood that the above described features of substrate board 200 may be used in other packaging arrangements. Semiconductor die 220 is also shown attached to substrate board 200 and wire bonds 222 interconnected to conductive traces 202 that overly the top surface of substrate board 200. This perspective clearly shows that encapsulating material 224 is in direct contact with first surface 116 and that solder mask 218 covers conductive traces 202 that are not covered with encapsulating material 224.

In another embodiment, a second solder mask 219 is typically applied over a bottom surface of substrate board 200. This is generally done to protect any number of conductive traces that may be patterned to interconnect a plurality of solder balls 212 to selected conductive vias 203 (not shown) and conductive traces 202. It should be understood that solder balls 212 merely depict one embodiment, and alternative conductive arrangements may include conductive leads, columns, contacts, etc.

Because solder mask 219 does not typically come into direct contact with liquid encapsulating materials during encapsulation processes, solder mask 219 may be any well known material suitable for protecting any conductive traces (not shown) that may underlie solder mask 219.

Figure 7:
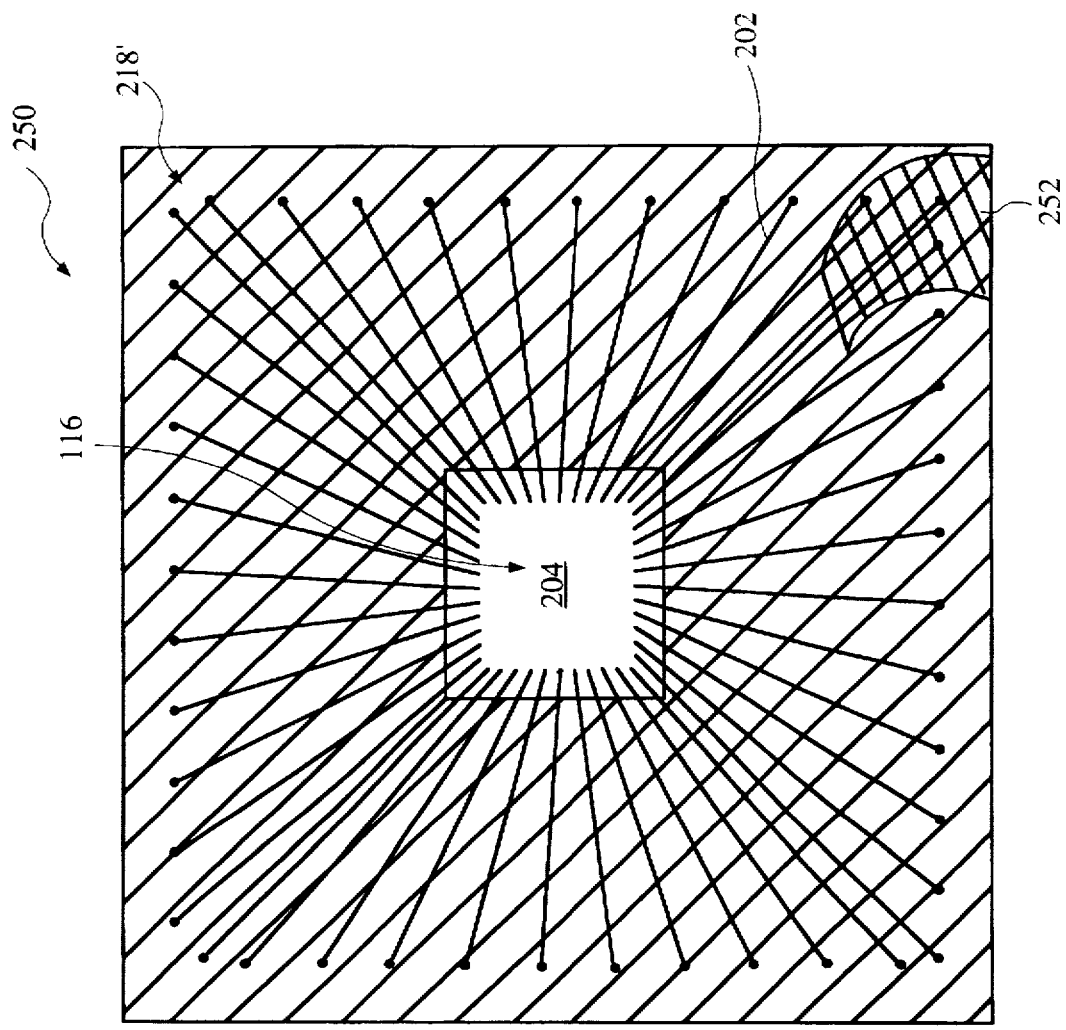
FIG. 7 is an illustration of an alternative embodiment having conventional solder mask materials and an anti-adhesive gate area in accordance with one embodiment of the present invention.

FIG. 7 illustrates an alternative embodiment where polyimide solder mask material is used to protect conductive traces 202. Generally, these solder masks are lower cost and offer higher performance since they are more resistive to cracking at a location under substrate board 200 than their expensive "highly adhesive" counterparts. In addition, the solder mask material is resistive to cracking even after autoclave (pressure cook) tests.

By way of example, in this embodiment, a solder mask 218' may be a liquid photo imagable (LPI) material. For exemplary purposes only, solder masks such as PSR4000-AUS5 or PSR 4000-AUS8 which are available from Taiyo Corporation of Japan may be used. As described above, LPI materials provide good adhesion to subsequently injected encapsulating materials. In this manner, the encapsulating materials will not inadvertently detach from solder mask 218' thereby damaging an encapsulated semiconductor die.

As shown, a die attach area 204 is typically not covered with solder mask 218' and conductive trace tips 202' (that lie near die attach area 204) are typically plated with gold or silver before wire bonding. Once the LPI solder mask 218' has been applied, a gate area 252 is preferably defined near a corner region. In this embodiment, gate area 252 will preferably be patterned with a polyimide film which will be anti-adhesive to subsequently injected encapsulating materials. In this manner, if encapsulating materials remain over gate area 252 after the encapsulating material hardens, it may be easily removed (e.g., de-gated) without damaging solder mask 218'. Furthermore, since the encapsulating material does not adhere well to polyimide materials, the dangers of removing solder mask 218' and lifting or exposing underlying conductive traces during de-gating will be avoided.

Furthermore, it should be appreciated that substantial cost savings may be realized since polyimide materials are typically less expensive than gold. Additionally, added design flexibility is gained since conductive traces may be routed under gate area 252 without causing electrical interference to a packaged semiconductor device. By way of example, because the polyimide material is a non-conduct material, electrical signals traveling along conductive traces 202 will generally be unaffected. This provides an identifiable advantage over conventional gold plated gates which unfortunately prevent the routing of conductive traces below conductively plated gate areas. Also, screen printing a small region over gate area 252 is typically much less laborious than gold plating gate areas.

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

what is claimed is:

1. A circuit board for use in a packaged semiconductor device, the circuit board comprising:

a substrate having first and second surfaces;

a plurality of conductive traces positioned on the substrate; and an anti-adhesive solder mask positioned on the first surface, the solder mask substantially defining a ring around an outer portion of the substrate such that a center portion of the first surface is exposed and does not contain the solder mask, wherein the ring of solder mask is sized such that the ring will extend outside the packaged semiconductor device such that encapsulation material that is deposited on the solder mask outside of the packaged semiconductor device may be easily removed without substantially damaging the packaged semiconductor device and wherein the ring is sized such that the ring will not substantially extend inside the packaged device.

2. The circuit board for use in a packaged semiconductor device as recited in claim 1, wherein the solder mask covers between about 5 percent and 30 percent of the first surface of the substrate.

3. The circuit board for use in a packaged semiconductor device as recited in claim 1, wherein the outer portion of the substrate covered by the solder mask includes a substrate perimeter, the substrate further comprising a second solder mask formed over the second surface of the substrate.

4. The circuit board for use in a packaged semiconductor device as recited in claim 1, wherein the anti-adhesive solder mask is a solder mask selected from the group consisting of a liquid photo imagable polyimide film and dry photo imagable polyimide film.

5. The circuit board for use in a packaged semiconductor device as recited in claim 1 wherein the substrate includes a die attach area within the center portion of the first substrate surface, the second substrate surface further including a plurality of conductive contacts, and wherein at least some of the traces have trace tips located adjacent the die attach area and are arranged to interconnect with associated conductive contacts.

6. The circuit board for use in a packaged semiconductor device as recited in claim 1, further comprising conductive vias for interconnecting traces formed on the first surface of the substrate with traces formed on the second surface of the substrate.

7. The circuit board for use in a packaged semiconductor device as recited in claim 1, wherein the plurality of contacts are configured to receive conductive solder balls.

8. The circuit board for use in a packaged semiconductor device as recited in claim 1, wherein the substrate is selected from the group consisting of a bismalimide triagine resin substrate, and a modified polyimide.

9. The circuit board for use in a packaged semiconductor device as recited in claim 1, wherein the plurality of conductive traces are patterned from a material selected from the group consisting of copper, gold and silver.

10. The circuit board for use in a packaged semiconductor device as recited in claim 9, wherein the conductive traces further include an anti-oxidation protective coating selected from the group consisting of gold and silver.

11. A packaged semiconductor device comprising:

a circuit board as recited in claim 1;

a die mounted on the die attach area of the first surface of the substrate;

interconnections that connect the die to selected ones of the plurality of conductive traces; and an encapsulating material for encasing the die, the bonding wires, and at least a portion of the selected conductive traces, the encapsulating material being arranged to substantially cover the center portion of the first substrate surface.

12. The packaged semiconductor device of claim 11, wherein the encapsulating material forms a cap over the first surface of the substrate and does not substantially overlap the solder mask.

13. The packaged semiconductor device of claim 11, wherein the encapsulating material is a mold compound.

14. The packaged semiconductor device of claim 1, wherein the interconnections are selected from the group consisting of wire bonds, tape automated bonding (TAB), flip-chip wafer bumps, Z axis conductive epoxies, and direct chip attach.

15. A circuit board for use in a packaged semiconductor device, the circuit board comprising:

a substrate having first and second surfaces;

a plurality of conductive traces positioned on the substrate; and an anti-adhesive solder mask positioned on the first surface the solder mask substantially defining a ring around an outer portion of the substrate such that a center portion of the first surface is exposed and does not contain the solder mask, wherein the solder mask ring around the outer portion of the substrate has a surface width that is between about 1 percent and about 20 percent of a first surface width of the substrate.

16. A circuit board for use in a packaged semiconductor device, the circuit board comprising:

a substrate having first and second surfaces wherein the first surface includes a gate area;

a plurality of conductive traces positioned on the substrate;

an adhesive solder mask positioned on the first surface and second surfaces; and a patterned anti-adhesive solder mask positioned on the gate area of the first surface of the substrate.

17. An circuit board for use in a packaged semiconductor device as recited in claim 16, wherein said anti-adhesive gate area material is selected from the group consisting of a liquid photo imagable polyimide and a dry film polyimide.

18. An circuit board for use in a packaged semiconductor device as recited in claim 16, wherein said anti-adhesive gate area can be patterned over conductive traces.

19. An circuit board for use in a packaged semiconductor device, the circuit board comprising:

a substrate having first and second surfaces;

a plurality of conductive traces positioned on the substrate;

an anti-adhesive solder mask positioned on the first surface, the anti-adhesive solder mask substantially defining an outer ring around an outer portion of the substrate such that a center portion of the first surface is exposed and does not contain the solder mask; and an adhesive solder mask positioned on the first surface, the adhesive solder mask covering an inner portion of the conductive traces.

20. The circuit board of claim 27, wherein the anti-adhesive solder mask ring around the outer portion of the substrate has a surface width that is between about 1 percent and about 20 percent of a first surface width of the substrate.

21. The circuit board of claim 27, wherein the anti-adhesive solder mask covers between about approximately 5 percent and 30 percent of the first surface of the substrate.

22. A packaged semiconductor device comprising:

a circuit board as recited in claim 27;

a die mounted on the die attach area of the first surface of the substrate;

interconnections that connect the die to selected ones of the plurality of conductive traces; and an encapsulating material for encasing the die, the bonding wires, and at least a portion of the selected conductive traces, the encapsulating material being arranged to substantially cover the center portion of the first substrate surface.

23. The packaged semiconductor device of claim 30, wherein the encapsulating material forms a cap over the first surface of the substrate, does not substantially overlap the anti-adhesive solder mask, and substantially overlaps the adhesive solder mask.

* * * * *